(12) United States Patent
Keller et al.

(10) Patent No.: US 6,550,040 B1
(45) Date of Patent: Apr. 15, 2003

(54) METHOD AND SYSTEM FOR IDENTIFYING DYNAMIC NAND OR NOR GATES FROM A NETLIST

(75) Inventors: S. Brandon Keller, Evans, CO (US); Gregory Dennis Rogers, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/994,149

(22) Filed: Nov. 26, 2001

(51) Int. Cl.[7] .............................................. G06F 17/50
(52) U.S. Cl. .............................................. 716/4; 716/2
(58) Field of Search ......................................... 716/4, 2

(56) References Cited

U.S. PATENT DOCUMENTS

| | | | | | |
|---|---|---|---|---|---|
| 5,734,798 A | * | 3/1998 | Allred | .......................... | 706/47 |
| 6,077,717 A | * | 6/2000 | McBride | ...................... | 438/10 |
| 6,249,899 B1 | * | 6/2001 | McBride et al. | ................ | 716/4 |
| 6,301,691 B1 | * | 10/2001 | McBride | ......................... | 716/5 |
| 6,367,062 B1 | * | 4/2002 | McBride | ...................... | 716/12 |
| 6,434,723 B1 | * | 8/2002 | McBride et al. | ................ | 716/4 |

OTHER PUBLICATIONS

K. Venkat et al., Timing Verification of Dynamic Circuits, Proceedings of the IEEE Custom Integrated Circuits Conference, pp. 271–274, May 1995.*

* cited by examiner

*Primary Examiner*—Matthew Smith
*Assistant Examiner*—A. M. Thompson

(57) ABSTRACT

A method for identifying dynamic NAND or NOR gates from a netlist having output nodes, supply voltages along with their opposite supply voltages, FETs and their connections, which includes the steps of selecting an output node from the netlist, identifying FETs having at least one branch that is connected directly to the selected output node but not connected directly to the supply voltage, verifying that the branch(es) of the identified FETs define a dynamic logic gate, and identifying either a NAND gate or a NOR gate for the dynamic logic gate.

11 Claims, 3 Drawing Sheets

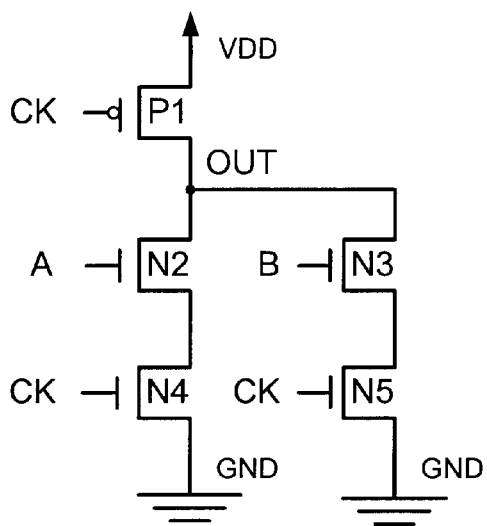
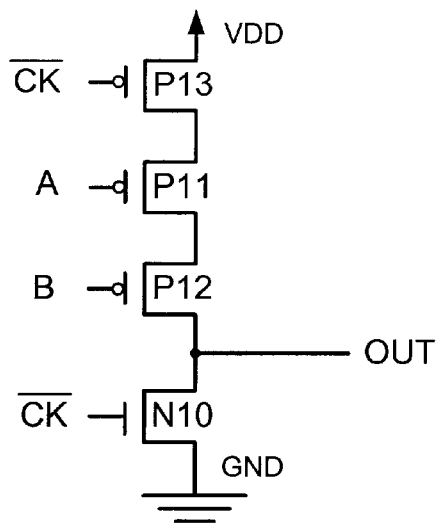
FIG. 3(a)	FIG. 3(b)
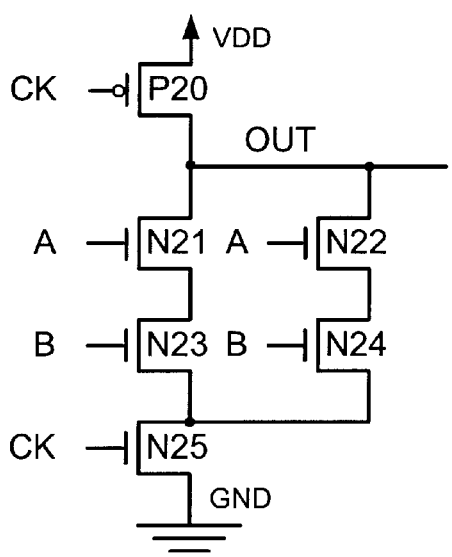
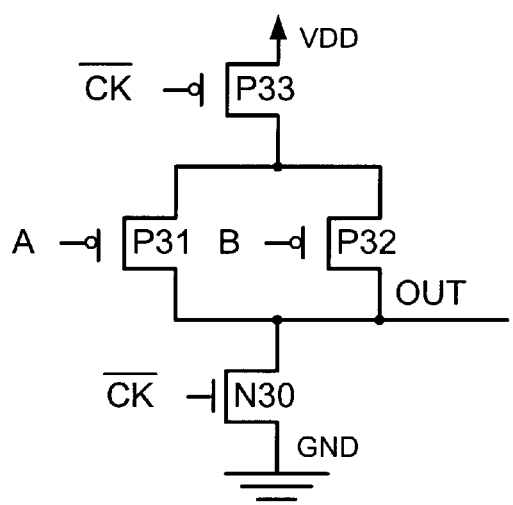
FIG. 4(a)	FIG. 4(b)

METHOD AND SYSTEM FOR IDENTIFYING DYNAMIC NAND OR NOR GATES FROM A NETLIST

The present invention generally relates to electronic logic gates comprised of transistors. More specifically, it relates to an improved method and system for identifying dynamic NAND or NOR gates from a netlist having output nodes, supply voltages along with their opposite supply voltages, and FETs with their connectivity.

Computer aided design (CAD) systems that design electronic circuits, often referred to as Electronic CAD (ECAD) systems, assist in the design of electronic circuits by providing a user with a set of software tools running on a digital computer with a graphical display device. The design process has now become so difficult that the current generation of integrated circuit (IC) chips, particularly in the case of very large scale integrated chips (VLSI), often cannot be designed without the help of ECAD systems. ECAD tools are ideally suited to performing tasks implemented in the circuit design process as they can break down large, complicated circuits into a plurality of circuits of relatively simpler functionality. The ECAD tools can then iteratively lay out these much simpler circuits and achieve the desired overall design of the desired large complicated circuit.

In performing a circuit design task, the ECAD tool generally allows for a user to schematically create and/or edit circuit designs by graphically placing and connecting circuit components, which may be represented as objects by the ECAD tool. The ECAD tool performs calculational circuit design and evaluation tasks for the schematic circuit, such as optimizing the circuit, testing the circuit through simulation modeling, and the like. As represented by the ECAD tool, the circuit may comprise a plurality of "nets," with each net representing a connection between the terminals of two transistors. A net may also be referred to as a signal. An ECAD tool also typically generates a "netlist," which is a list of a group of logically related nets, including connectivity data for each. The netlist may be in the form of a database. Also, the netlist may describe a multiplicity of nets that can number into the millions for VLSI related tasks. As a result, netlists can be of enormous size and complexity.

Different types or sub-tools of an ECAD tool may be used in IC design/evaluation tasks. In particular, ECAD tools can be used to identify the topology of a design stored on a netlist by identifying constituent field effect transistors ("FETs") that comprise logic gates. FETs are transistors with a region of donor material with two terminals called the "source" and the "drain". Between the source and the drain is an adjoining region of acceptor material between, called the "gate". The voltage between the gate and the substrate controls the current flow between the source and the drain by depleting the donor region of its charge carriers to a greater or lesser extent. A design may have thousands or millions of FETs on the chip, which makes it impractical to identify the topologies without the use of automated methods. This is especially true with a netlist having dynamic logic gates. Unlike static logic gates, the circuit outputs change dynamically with dynamic logic gates, which are usually but not necessarily controlled by clock signals.

There are currently some existing tools for identifying dynamic circuits from a netlist, but they are generally cumbersome and limited. This is so because they require not only the topologies of the chip, but also knowledge of the clock signals that drive the FETs. More specifically, users must indicate all the clock signals before the tools can automatically identify the logic gates from the netlist. Thus, there is a need for an improved method for identifying topologies of chip designs.

BRIEF SUMMARY OF THE INVENTION

The present invention is directed to an improved method and system for identifying the topologies of a chip design. More specifically, it relates to an improved method and system for identifying dynamic NAND or NOR gates from a netlist having output nodes, supply voltages along with their opposite supply voltages, and FETs with their connectivity. A NAND logic gate is a logic gate representing the Boolean function which is true unless both its arguments are true. A NOR logic gate is a logic gate representing the Boolean function which is true if none of its inputs are true and false otherwise.

The present invention provides a method that includes the steps of selecting an output node from the netlist, identifying FETs, having at least one branch, that are connected directly to the selected output node but not connected directly to the supply voltage, verifying that the branch(es) of the identified FETs define a dynamic logic gate, and identifying either a NAND gate or a NOR gate for the dynamic logic gate.

The present invention also provides a computer system that includes a storage medium, a processor for executing a program stored on the storage medium for selectively identifying dynamic NAND or NOR gates from potential output nodes, supply voltages with their opposite supply voltage, and FETs with their connectivity, wherein the program includes a set of instructions for: selecting an output node from the netlist, identifying FETs having at least one branch that are connected directly to the selected output node but not connected directly to the supply voltage, verifying that the branch(es) of the identified FETs define a dynamic logic gate, and identifying either a NAND gate or a NOR gate for the dynamic logic gate.

DESCRIPTION OF THE DRAWINGS

FIGS. 3(a) and (b) show examples of interconnected FETs including a NOR gate identified by the method shown in FIG. 2; and, FIGS. 4(a) and (b) show examples of interconnected FETs including a NAND gate identified by the method shown in FIG. 2.

DETAILED DESCRIPTION

Broadly stated, the present invention is directed to an improved method and system for identifying dynamic NAND or NOR gates from an integrated circuit ("IC") topology. These dynamic gates are comprised of Field Effect Transistors ("FET"). In the present invention, an output node is first selected from the netlist. Then, FETs having at least one branch that is connected directly to the selected output node but not connected directly to a supply voltage or its opposite supply voltage are identified. In this context, a branch is defined as a single path from an output node to a supply rail (e.g., VDD or GND) through channel connected FETs. The channel connected FETs are FETs that are connected together from one's source to another's drain. The branch(es) of the identified FETs is/are verified that a dynamic logic gate is defined, and finally either a NAND gate or a NOR gate is identified for the dynamic logic gate.

The method and system provide a way to identify dynamic NAND or NOR gates within a circuit netlist while maintaining knowledge of gate signals. While existing methods recognize dynamic circuits based on the topology of the design and the knowledge of clock signals, which require users to indicate all the clock signals beforehand, the present invention is able to identify dynamic NAND or NOR gates regardless of the name or type of signal acting as its pull-up or pull-down.

Figure 1:
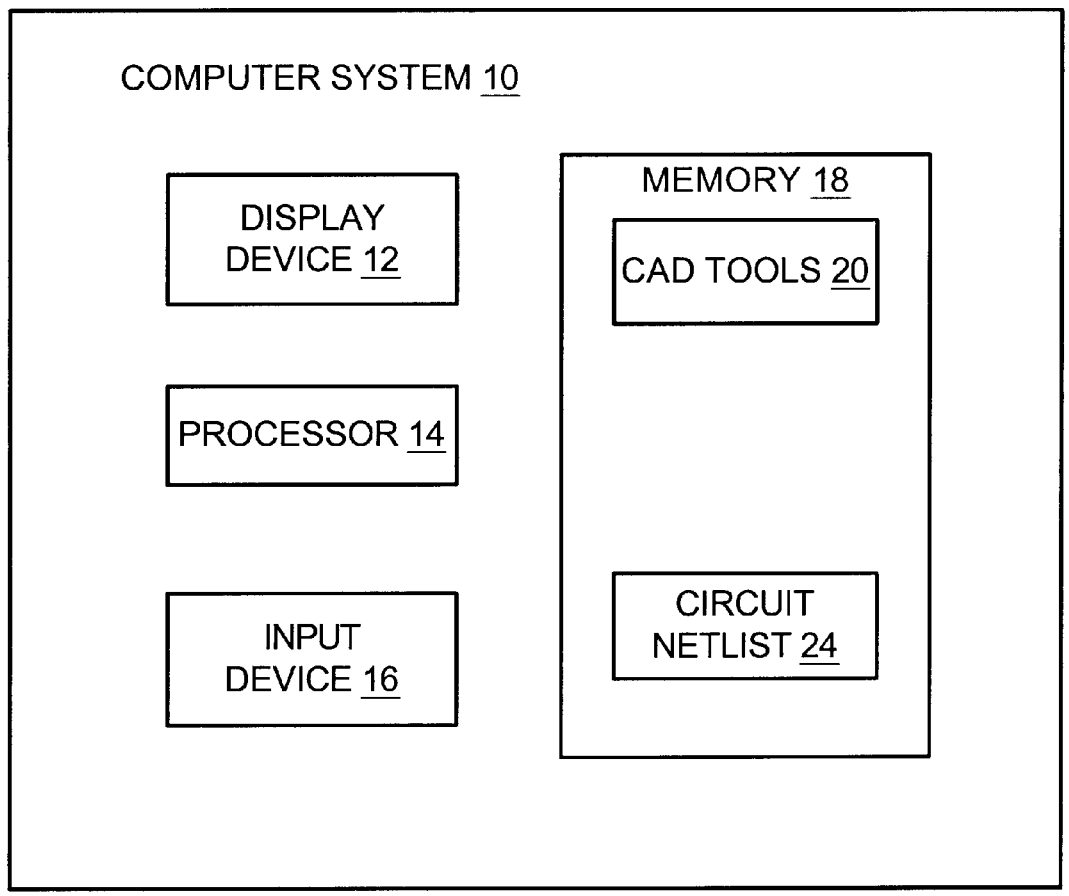
FIG. 1 shows a block diagram of a computer system on which the method may be performed.

A block diagram of a computer system on which the present invention may be implemented is shown in FIG. 1, and indicated generally at 10. As with most typical computer systems, there is a display device 12 for displaying data to users, a processor 14 for processing data, an input device 16 for users to input data, and memory 18 for storing the data. The processor 14 accesses the memory 18, which may store, among other things, CAD tools 20 and a circuit netlist (herein "netlist") 24. The CAD tools 20 are stored in the memory 18 for analyzing the netlist 24, which is a data file for storing the topology of the chip design. When in use, the input device 12 receives a command for instructing the processor 14 to call the CAD tool software 20 to perform a circuit analysis on the circuit netlist 24. The result of the analysis may then be displayed on the display device 12 to the users.

As a result of the many possible implementations for the present invention, an explanation of the current preferred embodiment of the computer system is given as an example. The complexity of the various available implementations is furthered not only by the use of different file formats that can change, but also because of the software or firmware that is needed to work with the given desired file formats. In trying to present a clearer description of the present invention, an ECAD implementation will be used as an example. However, it should be understood that others skilled in the art can appreciate the implementations of the various systems and configurations, and these implementations are within the scope of the present invention.

Figure 2:
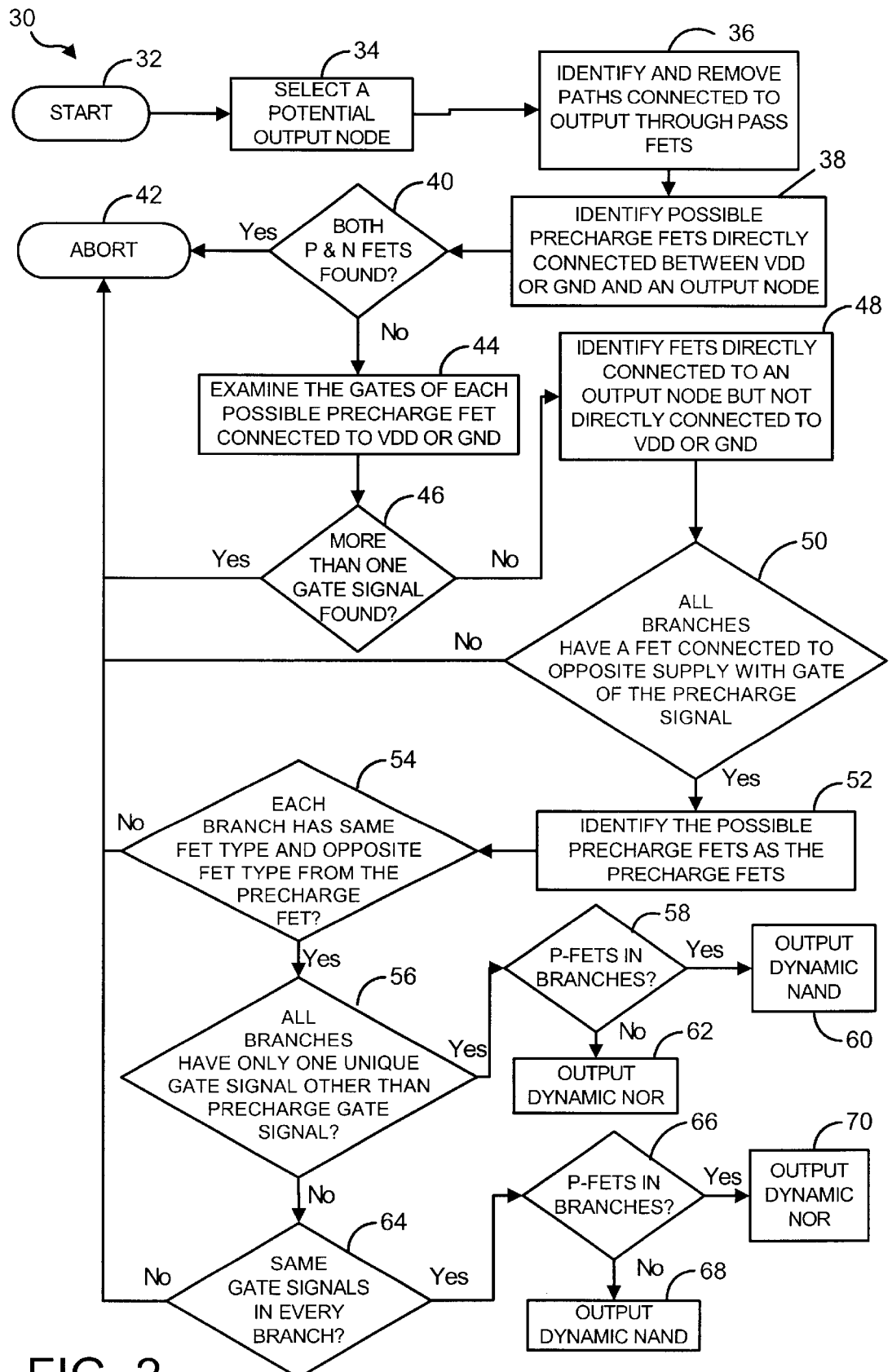
FIG. 2 shows a flow chart of the preferred functionality of a method for identifying dynamic NAND or NOR gates from a netlist.

Turning to an important aspect of the present invention, a flow chart of the preferred functionality of a method for identifying dynamic NAND or NOR gates is shown in FIG. 2, and indicated generally at 30. The method is initiated by a user, preferably through the input device 16, calling a command to start the method. However, automatic initiation by a computer program is also contemplated, depending on the design and needs of the implementation. Upon the start of the method (block 32), a potential output node is first selected from the netlist (block 34). From the selected output node, any paths connected to the output node through pass FETs are then identified and removed from the netlist (block 36). A pass FET is a FET that acts as a switch between two gates and prevents the output signal of one gate from reaching the input of the other. When the pass FET is on, it allows the output signal to reach the input of the next gate. Pass FETs are generally marked as such by the VLSI designer or identified as such by other ECAD analysis tools. Thus, the FETs will be specifically indicated as pass FETs in the circuit netlist, and they are easily identifiable. By removing the paths connected to the output node through the pass FETs, a smaller in-memory representation of the netlist can be achieved by trimming out the pass FETs and any connections to the pass FET (e.g., source or drain).

Next, to verify that dynamic logic gates are being used with the selected output node, FETs that are directly connected between the output node and a supply voltage, such as VDD or GND, are identified (block 38), which will be herein referred to as "identified possible precharge FETs."

From these identified possible precharge FETs, it is next determined whether both a PFET and a NFET are found (block 40). If the identified possible precharge FETs include both a PFET and a NFET, then the process is aborted (block 42), since this indicates that this portion of the netlist does not define a dynamic NAND or NOR gate. Otherwise, the next verification step continues, and the gate signals of each identified possible precharge FET connected to a supply voltage (e.g., VDD or GND) are examined (block 44).

It is then determined whether there is more than one gate signal found for each identified precharge FET (block 46). In other words, it is determined, from the identified possible precharge FETs, whether there is only one gate signal name found for all possible precharge FETs connected between the output node and the supply voltage. Again, the process is aborted (block 42) when more than one gate signal is found, because this indicates that this portion of the netlist does not define a NAND or NOR gate. On the other hand, if no more than one gate signal is found (block 46), the process continues. FETs that are directly connected to an output node but not directly connected to either the supply voltage or its opposite supply voltage (e.g., VDD and GND) are next identified (block 48), which will be herein referred to as the "identified FETs" as opposed to the "identified possible precharge FETs" from the previous steps.

Next, it is determined whether all branches have a FET that is connected to the opposite supply voltage of the supply voltage connected to the precharge FETs with a gate signal name that is identical to the gate signal name of the precharge FET (block 50). In other words, it is determined whether each of the branches has a FET that is connected to the opposite voltage supply, and whether this FET has a gate of the precharge signal. If it is determined that such a FET cannot be found on all the branches, the process is aborted (block 42), because this indicates that one of the branches is not associated with a dynamic logic gate. Otherwise, once it is determined that all branches have a FET connected to the opposite supply voltage with a gate of the precharge signal, the process continues. Once it has been determined that such a FET was found for all branches, it is then confirmed that the identified possible precharge FET is the actual precharge FET. Accordingly, the identified possible precharge FET is identified herein as the precharge FET (block 52).

It is next determined whether each branch of the identified FETs has the same FET type (e.g., NFET or PFET) and the opposite FET type from the precharge FET (block 54). More particularly, when checking on the same FET type, the branches containing the identified FETs are checked to determine whether they all have FETs that are of the same FET type, which can either be a NFET or a PFET. Upon determining that the FETs of all branches of the identified FETs are of the same FET type, it is then checked whether the single FET type identified from the branches is opposite from the FET type of the precharge FET.

If any of the branches either does not have the same FET type or is not the opposite FET type from the precharge FET (block 54), the process is aborted (block 42). Otherwise, the process continues, and the steps for identifying either a NAND logic gate or a NOR logic gate are performed for the dynamic logic gate of the output node.

It is next determined whether all the branches of the identified FETs have only one unique signal other than the precharge signal on each branch (block 56). If so, it is then determined whether the FETs of all branches are PFETs (block 58). If the FETs of all branches are PFETs (block 58), a dynamic NAND logic gate is outputted as a result (block 60). On the other hand, if the FETs of the branches are not PFETs (block 58), a dynamic NOR logic gate will be outputted (block 62).

However, if any branch of the identified FETs does not have only one unique signal other than the precharge signal (block 56), it is determined whether the same gate signals are in every branch (block 64). For example, if there are two branches, the FET(s) of the first branch is compared with the FET(s) of the second branch to determine whether the FETs from the two branches have the same gate signals. If, on the other hand, there is only one branch, it will always be true that the same gate signals are in every branch, since there is only one branch. If it is determined that the same gate signals are not in every branch of the identified FET (block 64), the process aborts without a result (block 42).

Otherwise, as expected, it should be true that the same gate signals are in every branch. In that case, it is again determined whether the FETs of the branches are PFETs (block 66). However, conversely to the previous steps, a dynamic NAND logic gate is outputted(block 68) for FETs that are not PFETs (block 66). Also, conversely to the previous steps, for the FETs that are PFETs (block 66), a dynamic NOR logic gate will be outputted as a result (block 70).

As shown, the present method enables dynamic logic gates to be identified without the need for users specifying the clock signals beforehand. In addition, the present invention works with netlists with any type of dynamic logic gates, regardless of the names or type of signals acting as its pull-up or pull-down. However, although the preferred method shown is implemented for an iteration of a single logic gate, it should be noted that alternative methods can be used for the present invention. For example, it is contemplated that the method can be relooped for identifying multiple logic gates from a single netlist or multiple netlists. Thus, it should be understood that these other alternative methods are contemplated and they are within the scope of the present invention. In addition, to clarify the method described, some examples of the NAND gate and the NOR gate have been shown in FIGS. 3 and 4, and an explanation of how the method can be used to identify these logic gates will be given.

Examples of interconnected FETs including a NOR gate and a NAND gate are shown in FIGS. 3(a)-(b) and FIGS. 4(a)-(b), respectively. Using the method shown in FIG. 2, the first step of the process is to identify an output node (block 34). After an output node has been selected, the next step is to identify and remove paths connected to the output node through the pass FETs (block 36). In this case, there is nothing to remove, since no pass FETs are shown in FIGS. 3(a)-(b) and FIGS. 4(a)-(b). The next step is to identify all possible precharge FETs that are directly connected between an output node and a supply voltage (block 38). In this example, the output node is indicated by the "OUT" and the supply voltage, which is either VDD or GND. The precharge FETs are, therefore, FETs that are directly connected between the OUT and either the VDD or the GND, which are P1 (i.e., the clock signal on the P tree) in FIG. 3(a), N10 (i.e., the clock signal on the N tree) in FIG. 3(b), P20 (i.e., the clock signal on the P tree) in FIG. 4(a) and N30 (i.e., the clock signal on the N tree) in FIG. 4(b). We see that P1, N10, P20 and N30 are the only precharge FETs found for each example, and thus both a PFET and a NFET are not found (block 40). Further, examining the gates of each possible precharge FET connected to the supply voltage (block 44), there is no more than one gate signal (block 46), because each of the identified possible precharge FETs have only one gate signal.

Continuing onto the next step in the process, FETs that are directly connected to an output node but not directly connected to a supply voltage (e.g., VDD or GND) are identified (block 48), and herein referred to as "identified FET." In FIG. 3(a), N2 and N3 will be identified, while P11 and P12 will be identified in FIG. 3(b). Similarly in FIGS. 4(a) and (b), N21, N22, N23, N24, P31 and P32 will be identified. As shown, all branches have a FET that is connected to an opposite supply with a gate of the precharge signal (block 50).

Recall in the previous steps, the supply voltage and the possible precharge FET was identified for each example. From the supply voltage and the possible precharge FET, there is also a FET connected to the opposite supply voltage. More specifically, in FIG. 3(a), the supply voltage is VDD and the possible precharge FET is P1 with the precharge gate signal of CK in the P-tree. So, in FIG. 3(a), the opposite supply voltage is GND on the two branches and the FETs connected are both N4 and N5, which have a gate of the opposite precharge signal (i.e., CK).

In particular, the branch with FET N2 has a FET (i.e., N4) that is connected to the opposite supply (i.e., GND) with the gate of the precharge signal (i.e., CK). Similarly, the branch with FET N3 contains a FET N5 that is connected to GND with the gate of the precharge signal CK. Note that in FIG. 3(a), the precharge FET is P1, which is connected to the supply voltage (i.e., VDD) with the precharge gate signal of CK.

In FIG. 3(b), the branch containing FET P11 and FET P12 has a FET N1O with the gate of the precharge gate signal (i.e., CK) that is connected to the opposite supply voltage (i.e., GND). For FIG. 4(a), the branch with FET N21 and FET N23 and the branch with FET N22 and FET N24, has a FET N25 connected to the opposite supply voltage with the gate of the precharge signal, while the branch containing FET P31 and the branch containing FET P32 has a FET N30 connected to the opposite supply voltage with the gate of the precharge signal in FIG. 4(b). Once it has been confirmed that all branches have a FET connected to the opposite supply with the gate of the precharge signal, the possible precharge signal can now be identified as the actual precharge signal (block 52).

In the next step, it is determined whether each branch has the same FET type and the opposite FET type from the precharge FET (block 54). This is obviously the case from our example. For instance, in FIG. 3(a), FETs N2, N3, N4 and N5 are all NFETs, which is of an opposite FET type from the precharge FET P1. The same is true in FIG. 3(b), more specifically FET P11, FET P12, FET P13 are PFETs (i.e., same FET type) with an opposite FET type from the precharge FET P13 (i.e., PFET). Similarly, turning to FIG. 4(a), N21, N22, N23, N24 and N25 are NFETs, which are of opposite FET type from the precharge FET of P20 (i.e., PFET). In FIG. 4(b), this is also true, since P31, P32 and P33 are PFETs, and the precharge FET N33 is a NFET.

Next, it is determined whether all branches have only one unique gate signal other than the precharge signals (block 56), but note that only FIGS. 3(a) and 4(b) would be true in this case. In FIG. 3(a), gate signal A of FET N2 and gate signal B of FET N3 are the only unique signals other than their precharge signals (i.e., CK) on their branches. Similarly in FIG. 4(b), gate signal A of P31 and signal B of P32 are the only unique signals other their precharge signals (i.e., CK) on their branches as well. From this determination, we next go to the step of determining whether the FET of all branches are PFETs (block 58). If so, a dynamic NAND is outputted (block 60). Otherwise, a dynamic NOR is outputted (block 62). Accordingly, since N2 and N3 are NFETs and not PFETs, the process will output a dynamic NOR gate as the result, which is correct since FIG. 3(*a*) represents a NOR gate. Similarly, a NAND gate will be outputted for FIG. 4(*b*), because P31 and P32 are PFETs.

Turning now to FIGS. 3(*b*) and 4(*a*) with not all branches having only a single unique signal other than their precharge signals, the next step is to determine whether the same signal names are in every branch of the identified FETs (block 64). More specifically, looking at the gate signal A of FET P11, gate signal B of FET P12 and gate signal CK of P13 in FIG. 3(*b*), we see that it is true that the same signal names are in every branch, since the branch with P11 P12 and P13 is the only branch. Similarly, this is also true with gate signals of N21, N22, N23, N24 and N25 in FIG. 4(*a*), which have two separate branches. One branch has gate signal A of N21, gate signal B of N23 and gate signal CK of N25, and the other branch has gate signal A of N22, gate signal B of N24 and gate signal CK of N25. As shown, the two branches have the same gate signals.

From this result, we continue the process to the next step of determining whether the FETs of the branches are PFETs (block 66). If not, a dynamic NAND is outputted (block 68). Otherwise, a dynamic NOR is outputted (block 70). As a result, a NOR gate will be returned in FIG. 3(*b*), since P11, P12 and P13 are all PFETs. In contrast, a NAND gate will be returned in FIG. 4(*a*), because N21, N22, N23, N24 and N25 are NFETs.

From the foregoing description, it should be understood that an improved system and method for identifying dynamic NAND or NOR gates from a netlist have been shown and described, which have many desirable attributes and advantages. The system and method provide a way for users to identify dynamic logic gates without the need to identify the clock signals beforehand. In addition, the present invention works with netlists with any type of dynamic logic gates, regardless of the name or type of the signal acting as its pull-up or pull-down. Consequently, the present invention provides a more flexible and less cumbersome way for identifying dynamic logic gates within a netlist.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A method for identifying dynamic NAND or NOR gates from a netlist having output nodes, supply voltages with their opposite supply voltages, and FETs with their connectivity, said method comprising the steps of:

selecting an output node from the netlist;

identifying FETs having at least one branch that are connected directly to the selected output node but not connected directly to the supply voltage;

verifying that said at least one branch of the identified FETs define a dynamic logic gate; and, identifying either a NAND gate or a NOR gate for the dynamic logic gate.

2. The method according to claim 1 wherein prior to said step of identifying FETs further comprises the steps of:

identifying paths that are connected to the selected output node through pass FETs; and, removing the identified paths from the netlist.

3. The method according to claim 1 wherein prior to said step of identifying FETs further comprises the steps of:

identifying possible precharge FETs having a gate signal that are directly connected between the selected output node and a supply voltage;

determining whether the identified possible precharge FETs include both a PFET and a NFET;

examining the gate signals of the identified possible precharge FETs that are connected to a supply voltage when the identified possible precharge FETs do not contain both a PFET and a NFET; and, aborting the identifying method when the identified possible precharge FETs contain both a PFET and a NFET.

4. The method according to claim 3 wherein said step of examining the gate signals further comprises the steps of:

determining whether there is more than one gate signal name found from the identified possible precharge FETs; and, aborting the process when more than one gate signal is found.

5. The method according to claim 3 wherein said step of identifying FETs further comprises the steps of:

determining whether all said at least one branch of the identified FETs has a FET connected to the opposite supply voltage of the supply voltage connected to said possible precharge FET with a gate signal name that is identical to the gate signal name of the possible precharge FETs;

identifying said possible precharge FET as the precharge FET having the precharge gate signal when all said at least one branch of the identified FETs has a FET connected to the opposite supply voltage with a precharge gate signal; and, aborting the identifying method when a branch is found without a FET connected to the opposite supply with a precharge signal gate.

6. The method according to claim 5 wherein said step of verifying comprises the steps of:

determining whether each said at least one branch of the identified FETs has the same FET type and an opposite FET type from the precharge FET; and, aborting the identifying method when a branch of the identified FETs that does not have the same FET type or the opposite FET type from the precharge FET is found.

7. The method according to claim 6 wherein said step of identifying either a NAND gate or a NOR gate comprises the steps of:

determining whether all said at least one branch of the identified FETs has only one unique gate signal other than the precharge gate signal;

determining whether the FETs of all said at least one branch of the identified FETs are PFETs when all said at least one branch of the identified FETs has only one unique gate signal other than the precharge gate signal; and, determining whether the same gate signals are in every said at least one branch of the identified FETs when all said at least one branch of the identified FETs does not have only one unique gate signal other than the precharge gate signal.

8. The method according to claim 7 wherein said step of determining whether the FETs of all said at least one branch of the identified FETs are PFETs further comprises:

outputting a dynamic NAND gate when the FETs of all said at least one branch of the identified FETs are FETs; and, outputting a dynamic NOR gate when the FETs of all said at least one branch of the identified FETs are not PFETs.

9. The method according to claim 7 wherein said step of determining whether the same gate signals are in every said at least one branch further comprises the steps of:

aborting the identifying method when not every said at least one branch of the identified FET has the same gate signals;

determining whether the FETs of all said at least one branch of the identified FETs are PFETs when every said at least one branch of the identified FET has the same gate signals;

outputting a dynamic NOR when the FETs of all said at least one branch of the identified FETs are PFETs; and, outputting a dynamic NAND when the FETs of all said at least one branch of the identified FETs are not PFETs.

10. A computer system for identifying dynamic NAND or NOR gates from a netlist having output nodes, supply voltages with their opposite supply voltages, and FETs with their connectivity, comprising:

a storage medium;

a processor for executing a program stored on the storage medium for identifying dynamic NAND or NOR gates from a netlist, the program comprising a set of instructions for:

selecting an output node from the netlist;

identifying FETs having at least one branch that are connected directly to the selected output node but not connected directly to the supply voltage;

verifying that said at least one branch of the identified FETs define a dynamic logic gate; and, identifying either a NAND gate or a NOR gate for the dynamic logic gate.

11. A computer program product comprising a computer usable medium having computer readable program codes embodied in the medium that when executed causes a computer to:

selecting an output node from the netlist;

identifying FETs having at least one branch that are connected directly to the selected output node but not connected directly to the supply voltage;

verifying that said at least one branch of the identified FETs define a dynamic logic gate; and, identifying either a NAND gate or a NOR gate for the dynamic logic gate.

* * * * *